(12) United States Patent
Sasaki

(10) Patent No.: US 12,456,681 B2
(45) Date of Patent: Oct. 28, 2025

(54) ELECTRONIC DEVICE

(71) Applicant: SUMITOMO ELECTRIC DEVICE INNOVATIONS, INC., Kanagawa (JP)

(72) Inventor: Atsuya Sasaki, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 363 days.

(21) Appl. No.: 18/329,926

(22) Filed: Jun. 6, 2023

(65) Prior Publication Data
US 2023/0411288 A1 Dec. 21, 2023

(30) Foreign Application Priority Data
Jun. 21, 2022 (JP) .................................. 2022-099361

(51) Int. Cl.
*H01L 23/528* (2006.01)
*H10D 86/85* (2025.01)

(52) U.S. Cl.
CPC .......... *H01L 23/5283* (2013.01); *H10D 86/85* (2025.01)

(58) Field of Classification Search
CPC ............. H01L 23/5283; H01L 23/5223; H01L 23/49838; H10D 86/85
See application file for complete search history.

(56) References Cited

U.S. PATENT DOCUMENTS

| | | |
|---|---|---|
| 2015/0200243 A1 | 7/2015 | Nonaka |
| 2018/0061697 A1 | 3/2018 | Yamada |
| 2019/0371672 A1 | 12/2019 | Nakano et al. |

FOREIGN PATENT DOCUMENTS

| | | |
|---|---|---|
| JP | H08-330517 | 12/1996 |
| JP | 2003-234411 | 8/2003 |
| JP | 2006-228977 | 8/2006 |
| JP | 2014-056887 | 3/2014 |
| JP | 2015-133424 | 7/2015 |
| JP | 2018-037497 | 3/2018 |
| JP | 2019-207945 | 12/2019 |
| WO | 2010/016171 | 2/2010 |

OTHER PUBLICATIONS

Office Action mailed on Aug. 26, 2025 with respect to the corresponding Japanese application No. 2022-099361.

*Primary Examiner* — Samuel A Gebremariam
(74) *Attorney, Agent, or Firm* — IPUSA, PLLC

(57) ABSTRACT

An electronic device includes a substrate, a first silicon nitride film provided on the substrate, a silicon oxide film provided on the first silicon nitride film, a capacitor provided on the silicon oxide film, and an interconnect electrically connected to the capacitor. The interconnect is disposed apart from the first silicon nitride film. In a plan view, an outer perimeter of the silicon oxide film is inside an outer perimeter of the first silicon nitride film.

14 Claims, 15 Drawing Sheets

ELECTRONIC DEVICE

CROSS-REFERENCE TO RELATED APPLICATIONS

This application claims priority to Japanese Patent Application No. 2022-099361 filed on Jun. 21, 2022, the entire contents of which are incorporated herein by reference.

BACKGROUND

1. Field of the Invention

The present disclosure relates to an electronic device.

2. Description of the Related Art

A method of manufacturing a metal-insulator-metal capacitor (MIM capacitor) having a metal-insulator-metal structure has been proposed (Japanese Unexamined Patent Application Publications Nos. 2019-207945 and 2014-56887). An Integrated passive device (IPD) having a capacitor is also known. In the IPD, an insulating film is formed on a substrate, and an interconnect connected to the capacitor is formed on the insulating film.

SUMMARY

An electronic device according to the present disclosure includes a substrate, a first silicon nitride film provided on the substrate, a silicon oxide film provided on the first silicon nitride film, a capacitor provided on the silicon oxide film, and an interconnect electrically connected to the capacitor. The interconnect is disposed apart from the first silicon nitride film. In a plan view, an outer perimeter of the silicon oxide film is inside an outer perimeter of the first silicon nitride film.

DETAILED DESCRIPTION

Figure 1:
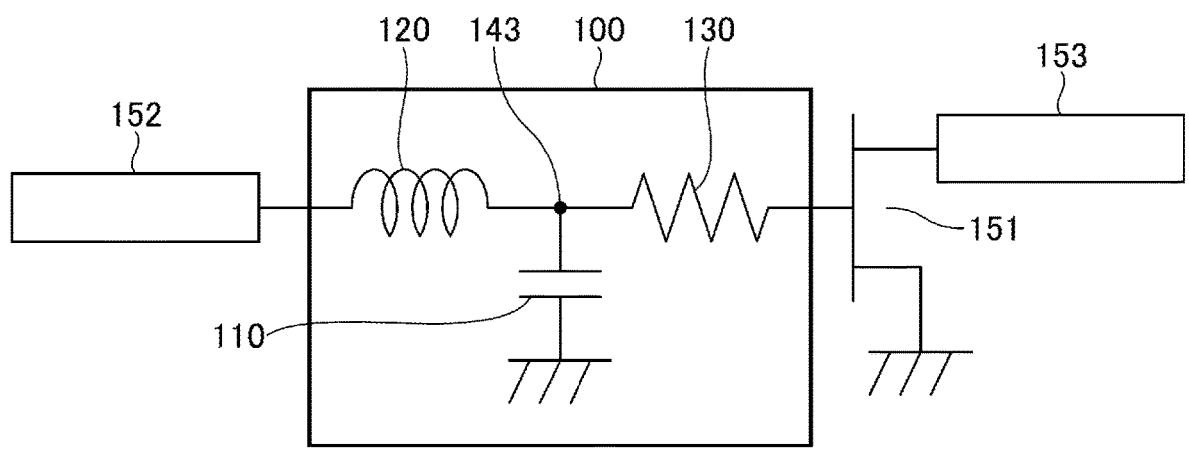
FIG. 1 is a circuit diagram illustrating an electronic device according to a first embodiment.

In a conventional IPD, a leak current may flow between a substrate and an interconnect.

An object of the present disclosure is to provide an electronic device in which a leak current between a substrate and an interconnect can be suppressed.

According to the present disclosure, the leak current between the substrate and the interconnect can be suppressed.

Description of Embodiments of the Present Disclosure

First, embodiments of the present disclosure will be listed and described.

[1] An electronic device according to an embodiment of the present disclosure includes a substrate, a first silicon nitride film provided on the substrate, a silicon oxide film provided on the first silicon nitride film, a capacitor provided on the silicon oxide film, and an interconnect electrically connected to the capacitor. The interconnect is disposed apart from the first silicon nitride film. In a plan view, an outer perimeter of the silicon oxide film is inside an outer perimeter of the first silicon nitride film.

The interconnect is disposed apart from the first silicon nitride film. For example, there may be a silicon oxide film between the interconnect and the first silicon nitride film in a thickness direction. Therefore, a leak current between the interconnect and the substrate can be suppressed. Also, since the outer perimeter of the silicon oxide film is on the inner side of the outer perimeter of the first silicon nitride film in a plan view, the outer perimeter of the silicon oxide film is not in direct contact with the substrate. When the outer perimeter of the silicon oxide film is in direct contact with the substrate, separation may occur from an interface between the outer edge of the silicon oxide film and the substrate. However, the separation can be suppressed in the electronic device according to the present embodiment.

[2] In the above [1], the capacitor may include a first electrode provided on the silicon oxide film, a dielectric film provided on the first electrode, and a second electrode provided on the dielectric film. The dielectric film may also be provided between the silicon oxide film and the interconnect. In this case, unevenness following the shape of the dielectric film can be reduced. Therefore, it is easy to relax the restriction on the arrangement of other elements arranged on the substrate. In addition, the leak current between the interconnect and the substrate can be further suppressed as compared with a case where the dielectric film is provided only around the capacitor. Further, when a plurality of capacitors are provided, it is easy to suppress leak currents between the plurality of capacitors.

[3] In the above [2], the electronic device may further include a second silicon nitride film covering the capacitor. The second silicon nitride film may be in direct contact with the first silicon nitride film outside the outer perimeter of the silicon oxide film. In this case, it is particularly easy to suppress separation.

[4] In the above [2] or [3], in the plan view, a distance between an outer perimeter of the dielectric film and the outer perimeter of the first silicon nitride film may be 0.5 µm to 5 µm. When the interconnect is provided above the dielectric film, if this distance is too large, the first silicon nitride film may become unnecessarily large. If this distance is too small, it may be difficult to bring the second silicon nitride film into direct contact with the first silicon nitride film.

[5] In any one of the above [1] to [4], in the plan view, a distance between the outer perimeter of the silicon oxide film and the outer perimeter of the first silicon nitride film may be 0.5 µm to 10 µm. When the interconnect is provided above the silicon oxide film, if this distance is too large, the first silicon nitride film may become unnecessarily large. If this distance is too small, it may be difficult to bring the second silicon nitride film into direct contact with the first silicon nitride film.

[6] In any one of the above [1] to [5], the electronic device may further include a passivation film covering the first silicon nitride film, the silicon oxide film, the capacitor, and the interconnect. In this case, the passivation film can protect the first silicon nitride film, the silicon oxide film, the capacitor and the interconnect.

[7] In any one of the above [6], the passivation film may be a polyimide film. In this case, it is easy to form the passivation film.

[8] In any one of the above (1) to (7), the electronic device may further include an inductor and a resistive element that are connected to the capacitor. In this case, an IPD can be configured.

[9] An electronic device according to another embodiment of the present disclosure includes a substrate, a first silicon nitride film provided on the substrate, a silicon oxide film provided on the first silicon nitride film, a capacitor provided on the silicon oxide film, a second silicon nitride film covering the capacitor, and an interconnect electrically connected to the capacitor. The capacitor includes a first electrode provided on the silicon oxide film, a dielectric film provided on the first electrode, and a second electrode provided on the dielectric film. The interconnect is disposed apart from the first silicon nitride film. The dielectric film is also provided between the silicon oxide film and the interconnect. In a plan view, an outer perimeter of the silicon oxide film is inside an outer perimeter of the first silicon nitride film. In the plan view, a distance between the outer perimeter of the silicon oxide film and the outer perimeter of the first silicon nitride film is 0.5 µm to 10 µm. The second silicon nitride film is in direct contact with the first silicon nitride film outside the outer perimeter of the silicon oxide film. Also in this case, the leak current between the interconnect and the substrate can be suppressed and the separation of the silicon oxide film or the like can be suppressed.

Details of Embodiments of the Present Disclosure

Embodiments according to the present disclosure will be described in detail below. Note that the present disclosure is not limited thereto. In the present specification and drawings, constituent elements having substantially the same functional configurations are denoted by the same reference numerals, and redundant description thereof may be omitted. In the present disclosure, a plan view refers to viewing an object in a direction perpendicular to a main surface of a substrate.

First Embodiment

Figure 2:
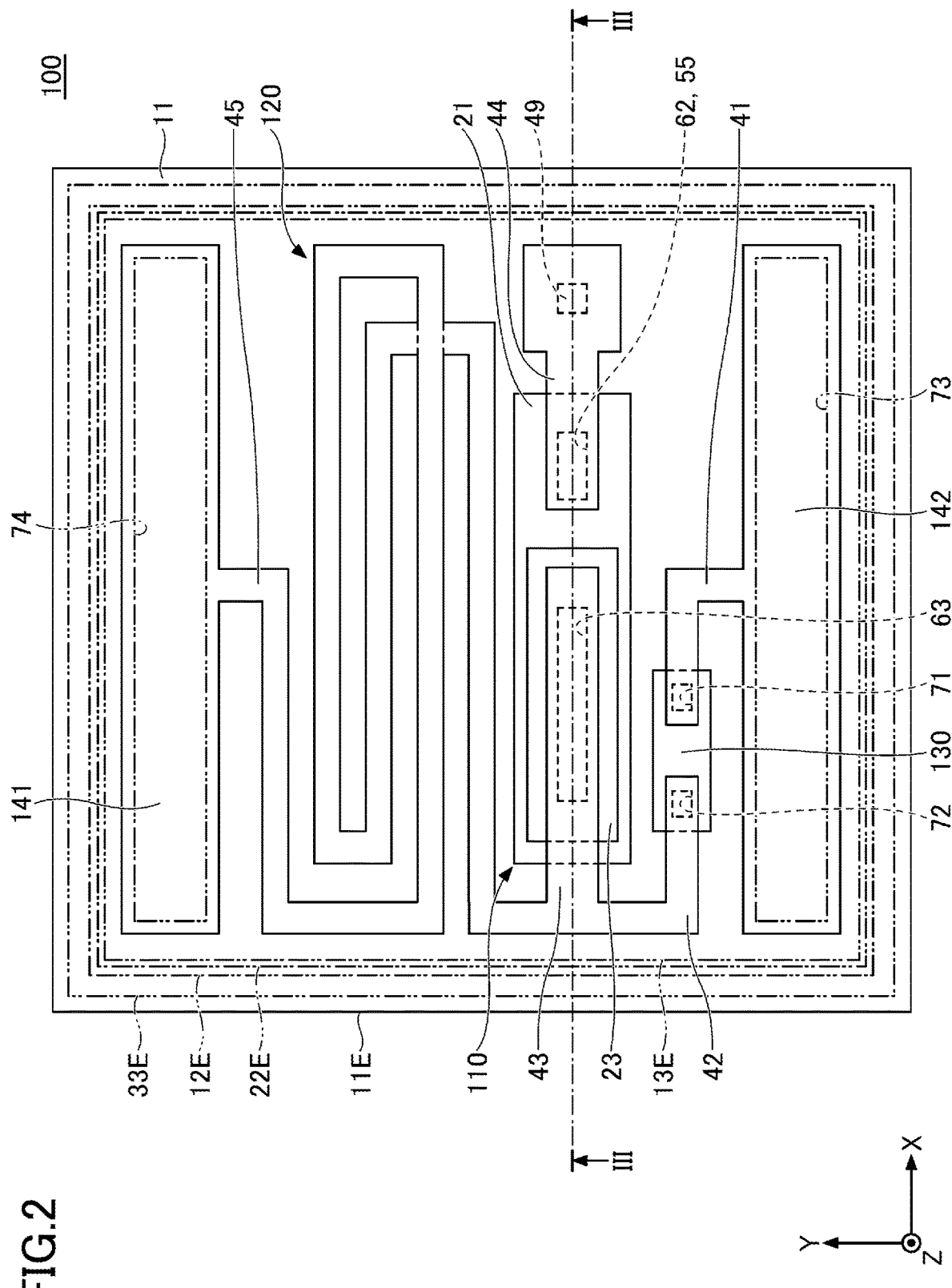
FIG. 2 is a top view illustrating an electronic device according to the first embodiment.
Figure 3:
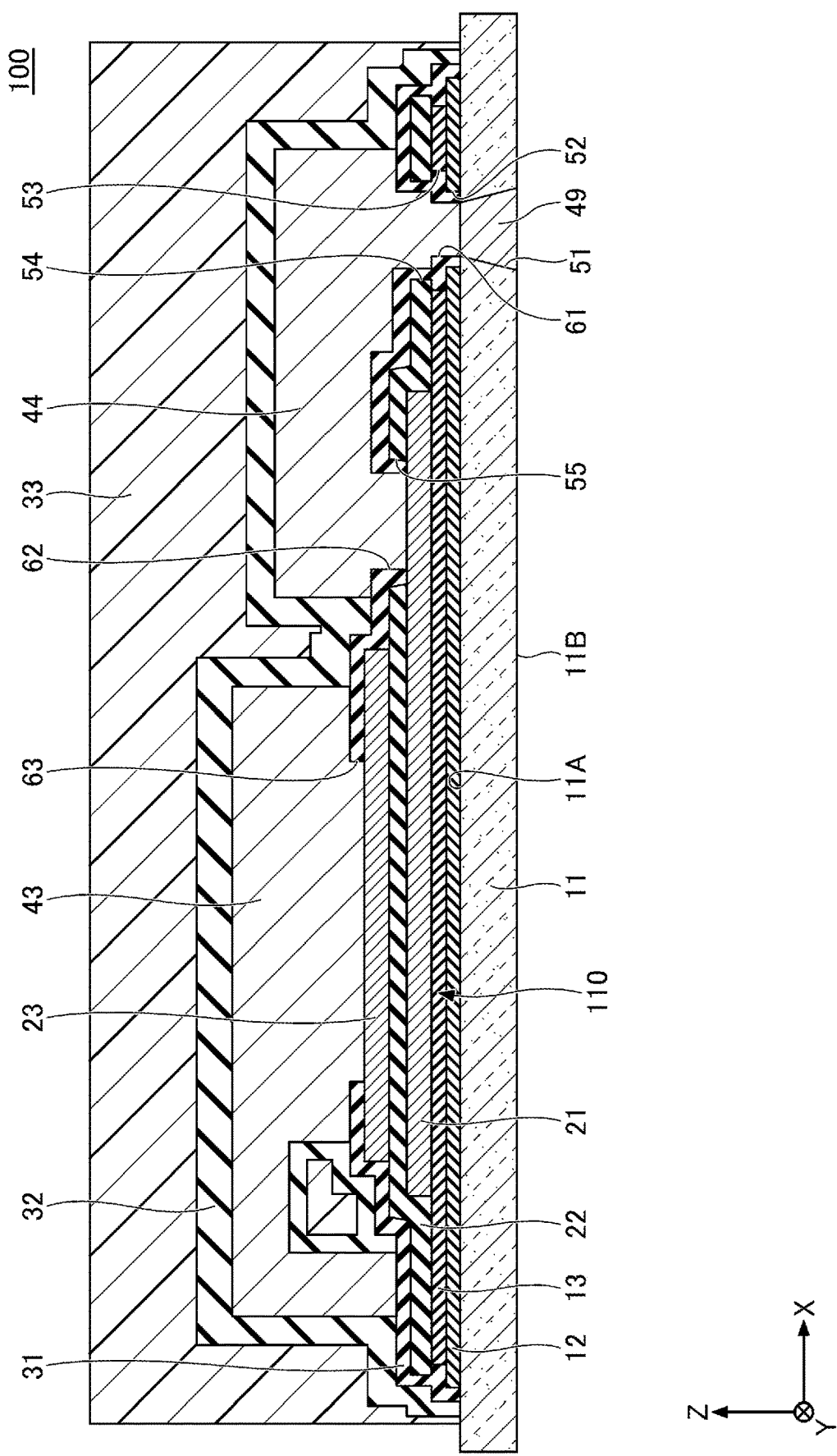
FIG. 3 is a cross-sectional view illustrating an electronic device according to the first embodiment.

First, a first embodiment will be described. The first embodiment relates to an electronic device including a capacitor. FIG. 1 is a circuit diagram illustrating an electronic device according to the first embodiment. FIG. 2 is a top view illustrating the electronic device according to the first embodiment. FIG. 3 is a cross-sectional view illustrating the electronic device according to the first embodiment. FIG. 3 corresponds to a cross-sectional view taken along line III-III in FIG. 2.

As shown in FIGS. 1 and 2, an electronic device 100 according to the first embodiment mainly includes a capacitor 110, an inductor 120, a resistive element 130, a pad 141, a pad 142, and a node 143. Inductor 120 is connected between pad 141 and node 143. Resistive element 130 is connected between pad 142 and node 143. Thus, inductor 120 and resistive element 130 are electrically connected in series between pad 141 and pad 142. Capacitor 110 is connected between node 143 and ground.

Electronic device 100 includes an interconnect 41, an interconnect 42, an interconnect 43, an interconnect 44, and an interconnect 45. Interconnect 41 connects pad 142 to resistive element 130. Interconnect 42 connects resistive element 130 to inductor 120. Interconnect 43 connects interconnect 42 to capacitor 110. Interconnect 44 connects capacitor 110 to a conductive via 49 (see FIG. 3). Conductive via 49 is connected to ground. Interconnect 45 connects inductor 120 to pad 141.

Electronic device 100 includes a substrate 11, a silicon nitride (SiN) film 12, a silicon oxide ($SiO_x$) film 13, a lower electrode 21, a dielectric film 22, an upper electrode 23, a silicon nitride film 31, a silicon nitride film 32, and a passivation film 33.

Substrate 11 is, for example, a silicon carbide (SiC) substrate, a silicon (Si) substrate, a gallium nitride (GaN) substrate, a gallium arsenide (GaAs) substrate, or a sapphire ($Al_2O_3$) substrate. The planar shape of substrate 11 is rectangular. As shown in FIG. 3, substrate 11 has a first main surface 11A and a second main surface 11B that are parallel to an X-Y plane. First main surface 11A is located above (on the positive Z side of) second main surface 11B. Substrate 11 further has two side surfaces parallel to a Y-Z plane and two side surfaces parallel to a Z-X plane.

Silicon nitride film 12 overlaps almost entire first main surface 11A in a plan view. In the plan view, an outer perimeter 12E of silicon nitride film 12 is inside an outer perimeter 11E of substrate 11. Silicon nitride film 12 has a thickness of, for example, 50 nm to 200 nm. In FIG. 2, outer perimeter 12E of silicon nitride film 12 is indicated by a dash double dot line, but silicon nitride film 12 is omitted. Silicon nitride film 12 is an example of a first silicon nitride film.

Silicon oxide film 13 overlaps almost entire first main surface 11A in the plan view. In the plan view, an outer perimeter 13E of silicon oxide film 13 is disposed inside outer perimeter 12E of silicon nitride film 12. In the plan view, a distance between outer perimeter 13E of silicon oxide film 13 and outer perimeter 12E of silicon nitride film 12 is, for example, 0.5 µm to 10 µm. Silicon oxide film 13 has a thickness of, for example, 100 nm to 300 nm. In FIG.

2, outer perimeter 13E of silicon oxide film 13 is indicated by a dash double dot line, but silicon oxide film 13 is omitted.

Lower electrode 21 is provided on silicon oxide film 13. Lower electrode 21 includes, for example, a gold-based metal layer. Lower electrode 21 may have a single-layer structure or a multi-layer structure. Lower electrode 21 has a thickness of, for example, 200 nm to 300 nm. For example, as shown in FIG. 2, a planar shape of lower electrode 21 is a rectangle whose long side is parallel to the X axis and whose short side is parallel to the Y axis.

Dielectric film 22 is provided on lower electrode 21 and silicon oxide film 13. Dielectric film 22 overlaps almost entire first main surface 11A in the plan view. In the plan view, an outer perimeter 22E of dielectric film 22 is between outer perimeter 12E of silicon nitride film 12 and outer perimeter 13E of silicon oxide film 13. In the plan view, a distance between outer perimeter 22E of dielectric film 22 and outer perimeter 12E of silicon nitride film 12 is, for example, 0.5 μm to 5 μm. Dielectric film 22 covers a top surface of silicon oxide film 13. Dielectric film 22 is, for example, a silicon nitride film. Dielectric film 22 has a thickness of, for example, 100 nm to 300 nm. In FIG. 2, outer perimeter 22E of dielectric film 22 is indicated by a dash double dot line, but dielectric film 22 is omitted.

Upper electrode 23 is provided on dielectric film 22. Upper electrode 23 includes, for example, a gold-based metal layer. Upper electrode 23 may have a single-layer structure or a multi-layer structure. Upper electrode 23 has a thickness of, for example, 200 nm to 300 nm. For example, as shown in FIG. 2, a planar shape of upper electrode 23 is a rectangle whose long side is parallel to the X axis and whose short side is parallel to the Y axis. In the plan view, an outer perimeter of upper electrode 23 is inside an outer perimeter of lower electrode 21.

Lower electrode 21, dielectric film 22, and upper electrode 23 are included in capacitor 110. Capacitor 110 is a so-called MIM capacitor. Lower electrode 21 is an example of a first electrode, and upper electrode 23 is an example of a second electrode.

A through hole 51 that extends through substrate 11 is formed in substrate 11. Through hole 51 is, for example, on the positive X side of lower electrode 21. An opening portion 52 that extends through silicon nitride film 12 is formed in silicon nitride film 12. Opening portion 52 is connected to through hole 51. An opening portion 53 that extends through silicon oxide film 13 is formed in silicon oxide film 13. Opening portion 53 is connected to opening portion 52. Opening portions 54 and 55 that extend through dielectric film 22 are formed in dielectric film 22. Opening portion 54 is connected to opening portion 53. Lower electrode 21 is exposed through opening portion 55.

Conductive via 49 is provided in through hole 51. Conductive via 49 has a surface (surface on the positive Z side) flush with first main surface 11A and a surface (surface on the negative Z side) flush with second main surface 11B. The material of conductive via 49 includes, for example, copper or gold-based metal.

Silicon nitride film 31 covers silicon nitride film 12, silicon oxide film 13, lower electrode 21, dielectric film 22 and upper electrode 23. Silicon nitride film 31 also covers each inner wall surface of opening portions 52, 53, 54 and 55. Silicon nitride film 31 is in direct contact with silicon nitride film 12 outside outer perimeter 13E of silicon oxide film 13. In FIG. 2, silicon nitride film 31 is omitted. Silicon nitride film 31 is an example of a second silicon nitride film.

Opening portions 61, 62 and 63 that extend through silicon nitride film 31 are formed in silicon nitride film 31. Opening portion 61 is disposed inside opening portions 52, 53 and 54, and a surface on the positive Z side of conductive via 49 is exposed through opening portion 61. Opening portion 62 is disposed inside opening portion 55, and lower electrode 21 is exposed through opening portion 62. Upper electrode 23 is exposed through opening portion 63.

Interconnect 43 is in direct contact with upper electrode 23 through opening portion 63. Interconnect 43 is connected to interconnect 42 on silicon nitride film 31. An intersection of interconnect 42 and interconnect 43 corresponds to node 143. Interconnect 44 is in direct contact with lower electrode 21 through opening portions 62 and 55, and is in direct contact with conductive via 49 through opening portions 61, 54, 53 and 52.

Resistive element 130 is provided between silicon oxide film 13 and dielectric film 22. Silicon nitride film 31 and dielectric film 22 have opening portions 71 and 72 that are formed to extend through silicon nitride film 31 and dielectric film 22 and reach resistive element 130. Interconnect 41 is connected to resistive element 130 through opening portion 71, and interconnect 42 is connected to resistive element 130 through opening portion 72.

Inductor 120 is connected to interconnects 42 and 45 on silicon nitride film 31. Pad 142 is connected to interconnect 41 on silicon nitride film 31, and pad 141 is connected to interconnect 45 on silicon nitride film 31. Inductor 120 includes, for example, a gold-based metal layer. Pads 141 and 142 include, for example, a gold-based metal layer.

Interconnects 41, 42, 43, 44 and 45 are disposed apart from silicon nitride film 12. That is, interconnects 41, 42, 43, 44, and 45 are not in direct contact with silicon nitride film 12. Inductor 120 is also disposed apart from silicon nitride film 12. That is, inductor 120 is not in direct contact with silicon nitride film 12.

Silicon nitride film 32 covers top surfaces, side surfaces, and bottom surfaces of interconnects 41, 42, 43, 44, and 45. Silicon nitride film 32 also covers a top surface of silicon nitride film 31. In FIG. 2, silicon nitride film 32 is omitted. Silicon nitride film 32 is an example of a second silicon nitride film.

Passivation film 33 is, for example, a polyimide film. Passivation film 33 covers substrate 11, silicon nitride film 12, silicon oxide film 13, lower electrode 21, dielectric film 22, upper electrode 23, silicon nitride films 31 and 32, and interconnects 41, 42, 43, 44, and 45. Passivation film 33 overlaps almost entire first main surface 11A in the plan view. In the plan view, an outer perimeter 33E of passivation film 33 is disposed inside outer perimeter 11E of substrate 11. In the plan view, outer perimeter 12E of silicon nitride film 12 is disposed inside outer perimeter 33E of passivation film 33. In plan view, a distance between outer perimeter 12E of silicon nitride film 12 and outer perimeter 33E of passivation film 33 is, for example, 1.5 μm to 15 μm. In the plan view, outer perimeter 13E of silicon oxide film 13 is on the inner side of outer perimeter 33E of passivation film 33. In the plan view, a distance between outer perimeter 13E of silicon oxide film 13 and outer perimeter 33E of passivation film 33 is, for example, 2 μm to 25 μm. In the plan view, outer perimeter 22E of dielectric film 22 is on the inner side of outer perimeter 33E of passivation film 33. In the plan view, a distance between outer perimeter 22E of dielectric film 22 and outer perimeter 33E of passivation film 33 is, for example, 2 μm to 23 μm. Passivation film 33 has a thickness of, for example, 3 μm to 10 μm. In FIG. 2, outer perimeter 33E of passivation film 33 is indicated by a dash double dot line, but passivation film 33 is omitted.

Opening portions 73 and 74 are formed in passivation film 33 and silicon nitride film 32. Opening portion 73 extends through passivation film 33 and silicon nitride film 32 to reach pad 142. Opening portion 74 extends through passivation film 33 and silicon nitride film 32 to reach pad 141.

For example, as shown in FIG. 1, a gate of a field effect transistor 151 is connected to pad 142, and a microstrip line 152 is connected to pad 141. A source of field effect transistor 151 is grounded, and a drain of field effect transistor 151 is connected to a microstrip line 153.

In the following, a method of manufacturing electronic device 100 according to the first embodiment will be described. Here, description will be made focusing on a periphery of capacitor 110. FIGS. 4 to 13 are cross-sectional views illustrating a method of manufacturing electronic device 100 according to the first embodiment.

Figure 4:
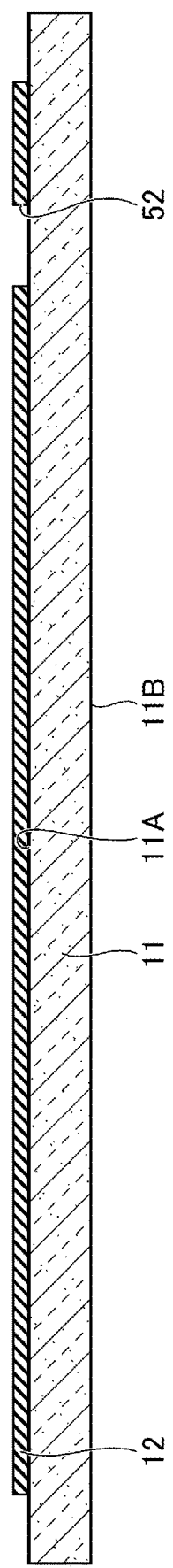
FIG. 4 is a cross-sectional view (No. 1) illustrating a method of manufacturing the electronic device according to the first embodiment.

As shown in FIG. 4, silicon nitride film 12 is formed on first main surface 11A of substrate 11, and opening portion 52 is formed in silicon nitride film 12. When opening portion 52 is formed, silicon nitride film 12 is removed from a portion to be a scribe region of substrate 11. Silicon nitride film 12 is formed by, for example, a chemical vapor deposition (CVD) method.

Figure 5:
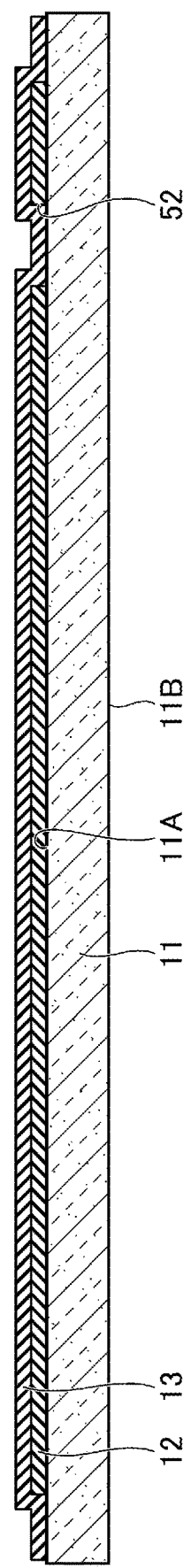
FIG. 5 is a cross-sectional view (No. 2) illustrating the method of manufacturing the electronic device according to the first embodiment.

As shown in FIG. 5, silicon oxide film 13 is formed on silicon nitride film 12 and substrate 11. Silicon oxide film 13 is formed by, for example, a CVD method.

Figure 6:
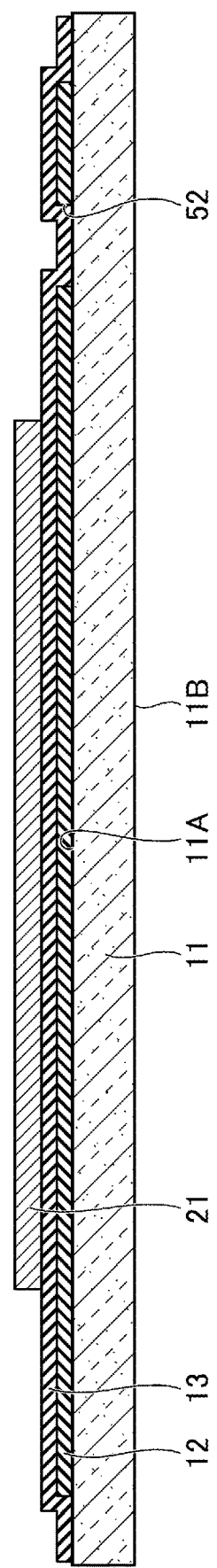
FIG. 6 is a cross-sectional view (No. 3) illustrating the method of manufacturing the electronic device according to the first embodiment.

As shown in FIG. 6, lower electrode 21 is formed on silicon oxide film 13. Lower electrode 21 is formed by, for example, a sputtering method or a vapor deposition method.

Figure 7:
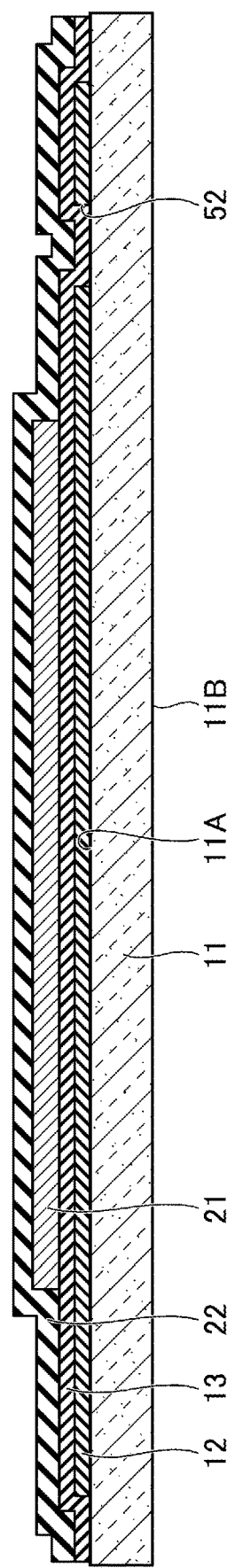
FIG. 7 is a cross-sectional view (No. 4) illustrating the method of manufacturing the electronic device according to the first embodiment.

As shown in FIG. 7, dielectric film 22 is formed on lower electrode 21 and silicon oxide film 13. Dielectric film 22 is formed by, for example, a CVD method.

Figure 8:
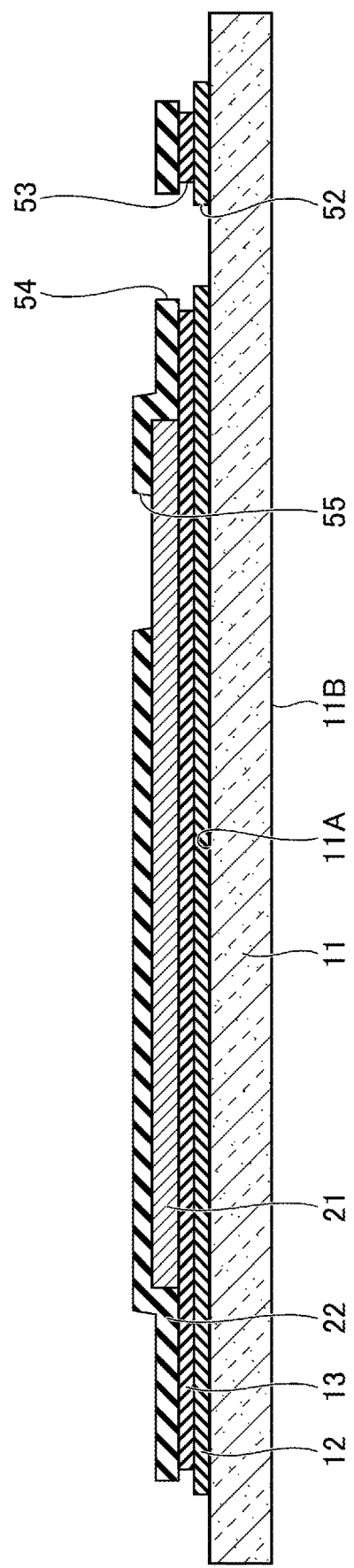
FIG. 8 is a cross-sectional view (No. 5) illustrating the method of manufacturing the electronic device according to the first embodiment.

As shown in FIG. 8, opening portion 54 is formed in dielectric film 22. Opening portion 54 is formed by, for example, dry etching using a fluorine-based gas. Subsequently, opening portion 53 is formed in silicon oxide film 13. Opening portion 53 is formed by using a hydrofluoric acid-based solution such as diluted hydrofluoric acid. When opening portion 53 is formed, an etching mask used when opening portion 54 is formed may be used as it is. When opening portion 54 is formed, outer perimeter 22E of dielectric film 22 is disposed inside outer perimeter 12E of silicon nitride film 12 in a plan view. In addition, when opening portion 53 is formed, outer perimeter 13E of silicon oxide film 13 is disposed inside outer perimeter 22E of dielectric film 22 in the plan view. At this time, a distance between outer perimeter 13E of silicon oxide film 13 and outer perimeter 12E of silicon nitride film 12 is set to, for example, 0.5 μm to 10 μm. Subsequently, opening portion 55 is formed in dielectric film 22. Opening portion 55 is formed by, for example, dry etching using a fluorine-based gas.

Figure 9:
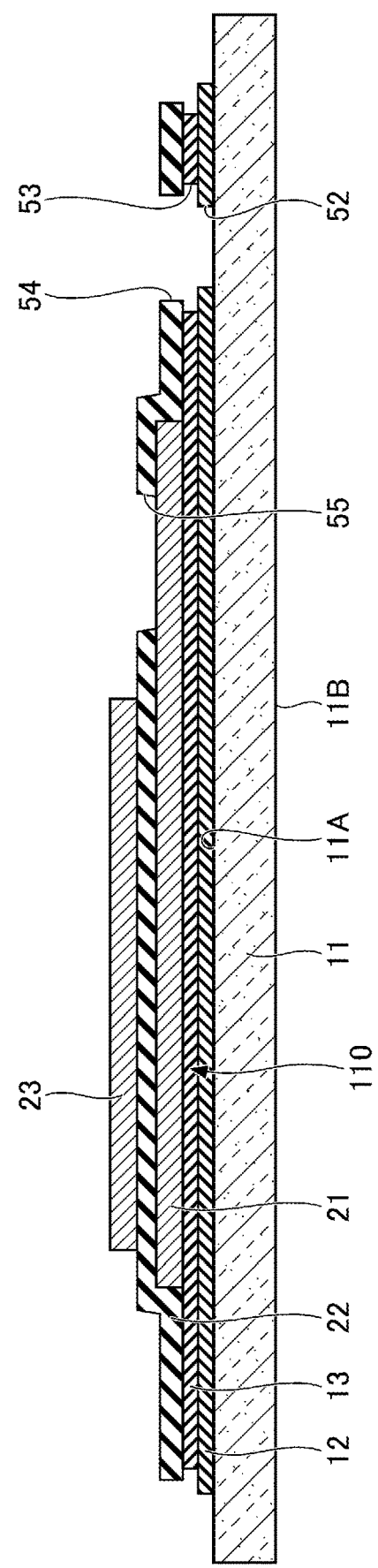
FIG. 9 is a cross-sectional view (No. 6) illustrating the method of manufacturing the electronic device according to the first embodiment.

As shown in FIG. 9, upper electrode 23 is formed on dielectric film 22. Upper electrode 23 is formed by, for example, a vapor deposition method combined with lift-off. Capacitor 110 including lower electrode 21, dielectric film 22 and upper electrode 23 is formed.

Figure 10:
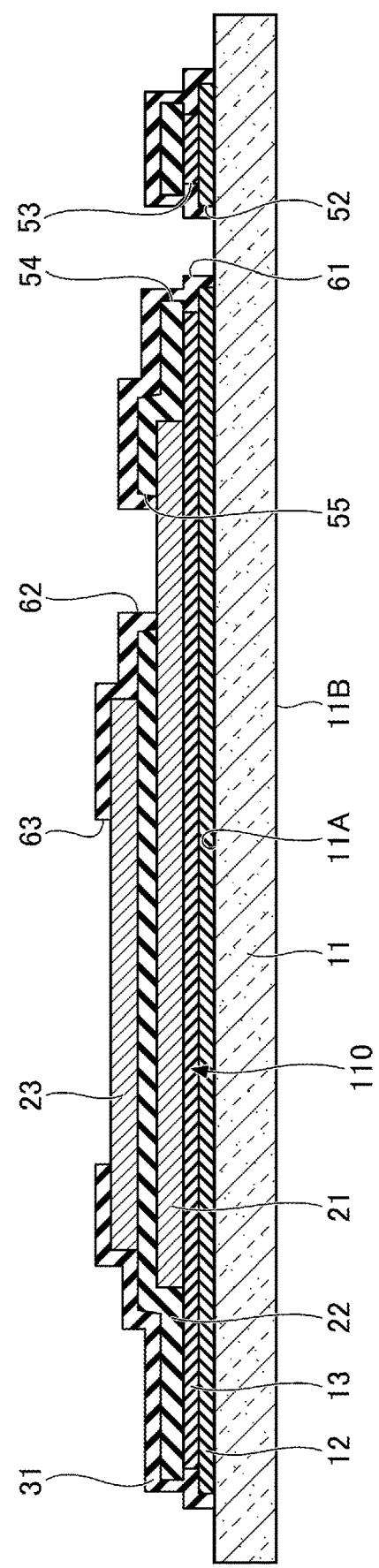
FIG. 10 is a cross-sectional view (No. 7) illustrating the method of manufacturing the electronic device according to the first embodiment.

As shown in FIG. 10, silicon nitride film 31 is formed on upper electrode 23 and dielectric film 22, and opening portions 61, 62 and 63 are formed in silicon nitride film 31. When opening portions 61, 62 and 63 are formed, silicon nitride film 31 is removed from the portion to be a scribe region of substrate 11. Silicon nitride film 31 is formed by, for example, a CVD method.

Figure 11:
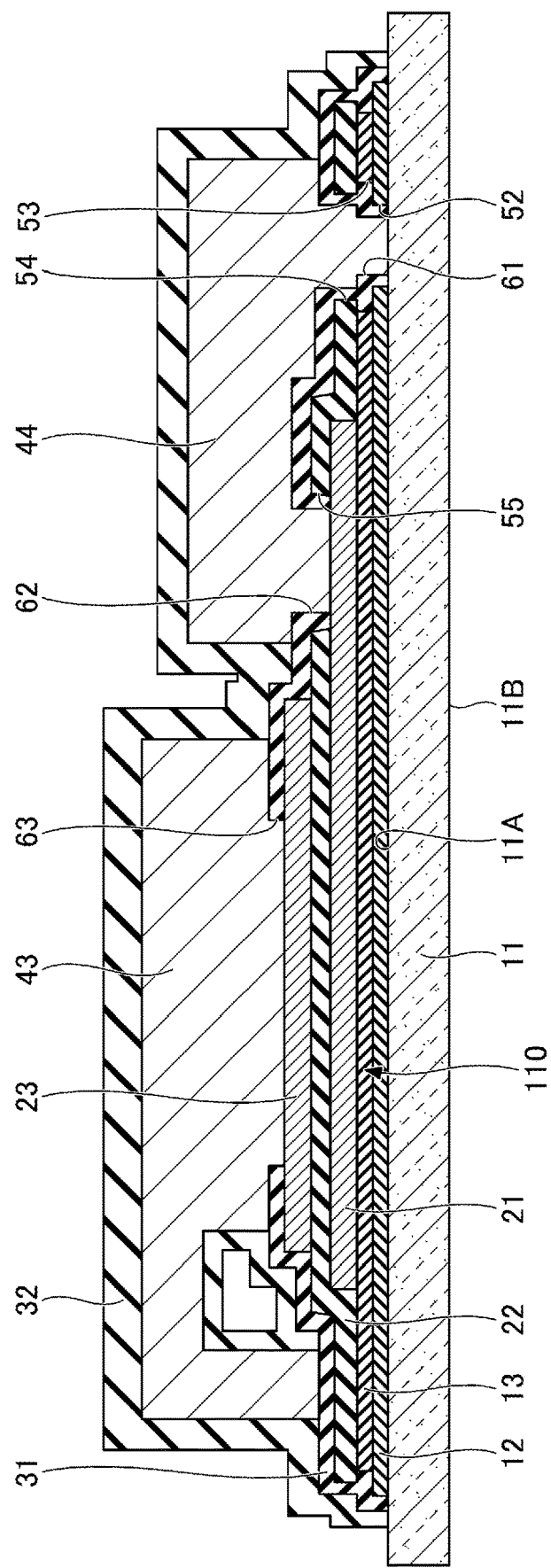
FIG. 11 is a cross-sectional view (No. 8) illustrating the method of manufacturing the electronic device according to the first embodiment.

As shown in FIG. 11, interconnects 41, 42, 43, 44 and 45 are formed (see also FIG. 2). Silicon nitride film 32 is then formed.

Figure 12:
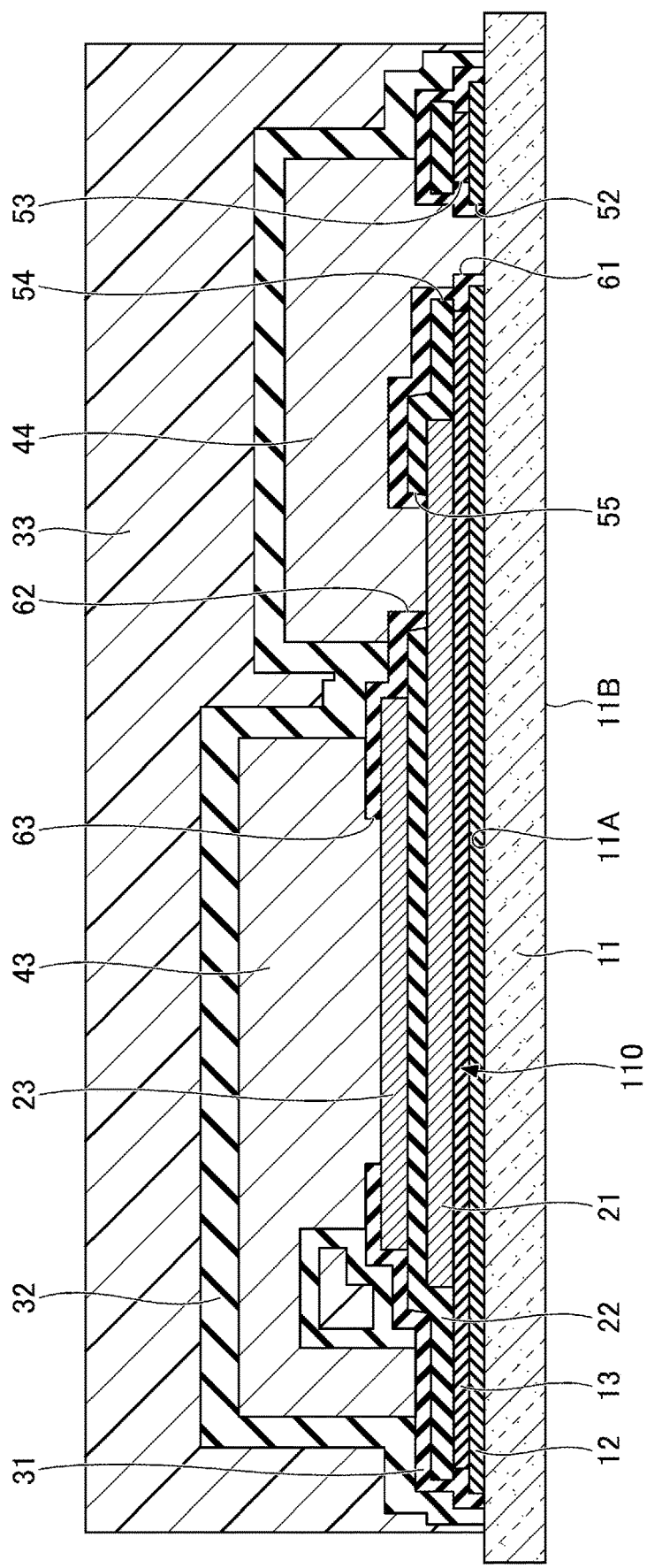
FIG. 12 is a cross-sectional view (No. 9) illustrating the method of manufacturing the electronic device according to the first embodiment.

As shown in FIG. 12, passivation film 33 is formed. When passivation film 33 is a polyimide film, passivation film 33 can be formed by, for example, forming a coating film, exposing the coating film to light, and developing the coating film.

Figure 13:
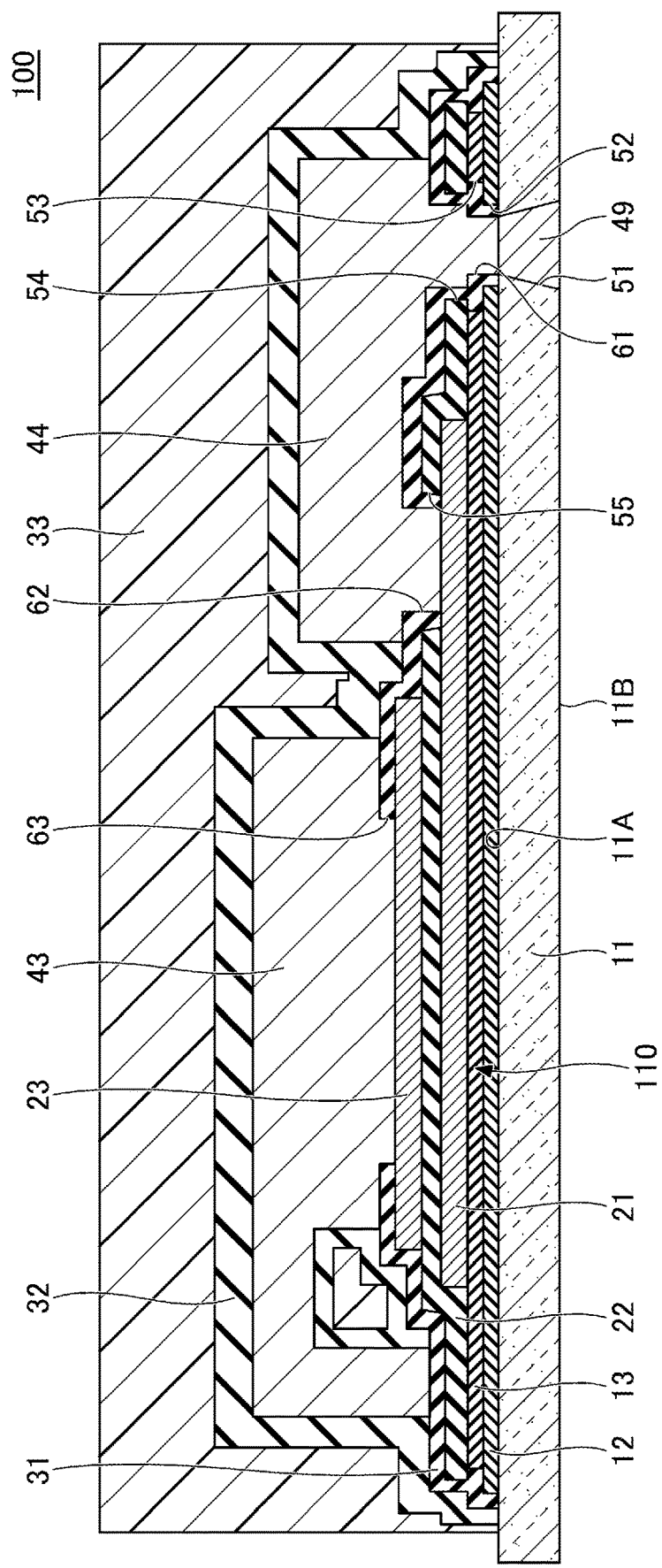
FIG. 13 is a cross-sectional view (No. 10) illustrating the method of manufacturing the electronic device according to the first embodiment.

As shown in FIG. 13, through hole 51 that reaches first main surface 11A from second main surface 11B is formed in substrate 11. Conductive via 49 is then formed in through hole 51.

In this manner, electronic device 100 according to the first embodiment can be manufactured.

In electronic device 100, interconnects 41, 42, 43, 44, and 45 are disposed apart from silicon nitride film 12. For example, in a thickness direction, there is silicon oxide film 13 between interconnects 41, 42, 43, 44, and 45 and silicon nitride film 12. Therefore, a leak current between interconnects 41, 42, 43, 44 and 45 and substrate 11 can be suppressed.

When attention is paid to the manufacturing method, in a case where silicon oxide film 13 is provided only below capacitor 110, pinholes may occur in silicon nitride film 12 during etching of silicon oxide film 13. In the present embodiment, since silicon oxide film 13 is widely formed, a region of silicon nitride film 12 where pinholes occur can be narrowed, and interconnects 41, 42, 43, 44, and 45 can be formed to avoid the region where pinholes occur. Therefore, the leak current between interconnects 41, 42, 43, 44 and 45 and substrate 11 can be suppressed.

Since outer perimeter 13E of silicon oxide film 13 is on the inner side of outer perimeter 12E of silicon nitride film 12 in the plan view, outer perimeter 13E of silicon oxide film 13 is not in direct contact with substrate 11. When outer perimeter 13E of silicon oxide film 13 is in direct contact with substrate 11, separation may occur from an interface therebetween. However, according to the present embodiment, separation can be suppressed. In particular, when silicon nitride films 31 and 32 are in direct contact with silicon nitride film 12 outside outer perimeter 13E of silicon oxide film 13, the separation may be easily suppressed.

Passivation film 33 can protect an inside of electronic device 100. When passivation film 33 is a polyimide film, it is easy to form passivation film 33. As a difference in thermal expansion coefficients between passivation film 33 and substrate 11 increases, the likelihood of occurrence of warpage increases in electronic device 100. Although the warpage of electronic device 100 generates a stress that induces the separation of silicon oxide film 13 and the like, according to the present embodiment, even when such a stress is generated, the separation can be suppressed.

Not only silicon oxide film 13 but also dielectric film 22 is widely formed, and dielectric film 22 is also provided between silicon oxide film 13 and interconnects 41, 42, 43, 44, and 45 in the thickness direction. Therefore, as compared with a case where dielectric film 22 is provided only around capacitor 110, unevenness following a shape of dielectric film 22 can be reduced. Hence, even when the arrangement of inductor 120 and resistive element 130 is determined in consideration of the unevenness, it is easy to arrange inductor 120 and resistive element 130 in a narrow range. Therefore, it is easy to miniaturize electronic device 100. In addition, as compared with the case where dielectric film 22 is provided only around capacitor 110, the leak current between interconnects 41, 42, 43, 44, and 45 and substrate 11 can be further suppressed. Furthermore, when a plurality of capacitors 110 is provided, it is easy to suppress leak currents between the plurality of capacitors 110.

Since capacitor 110, inductor 120, and resistive element 130 are appropriately connected, electronic device 100 may be used as an IPD.

In the plan view, the distance between outer perimeter 13E of silicon oxide film 13 and outer perimeter 12E of silicon nitride film 12 is preferably 0.5 μm to 10 μm, more preferably 2 μm to 8 μm. When interconnects 41, 42, 43, 44, and 45 are formed above silicon oxide film 13, if this distance is too large, silicon nitride film 12 may become unnecessarily large. If this distance is too small, it may be difficult to bring silicon nitride film 31 into direct contact with silicon nitride film 12.

Also, in the plan view, a distance between outer perimeter 22E of dielectric film 22 and outer perimeter 12E of silicon nitride film 12 is preferably 0.5 μm to 5 μm, more preferably 1.5 μm to 4 μm. When interconnects 41, 42, 43, 44 and 45 are formed above dielectric film 22, if this distance is too large, silicon nitride film 12 may become unnecessarily large. If this distance is too small, it may be difficult to bring silicon nitride film 31 into direct contact with silicon nitride film 12.

Second Embodiment

Figure 14:
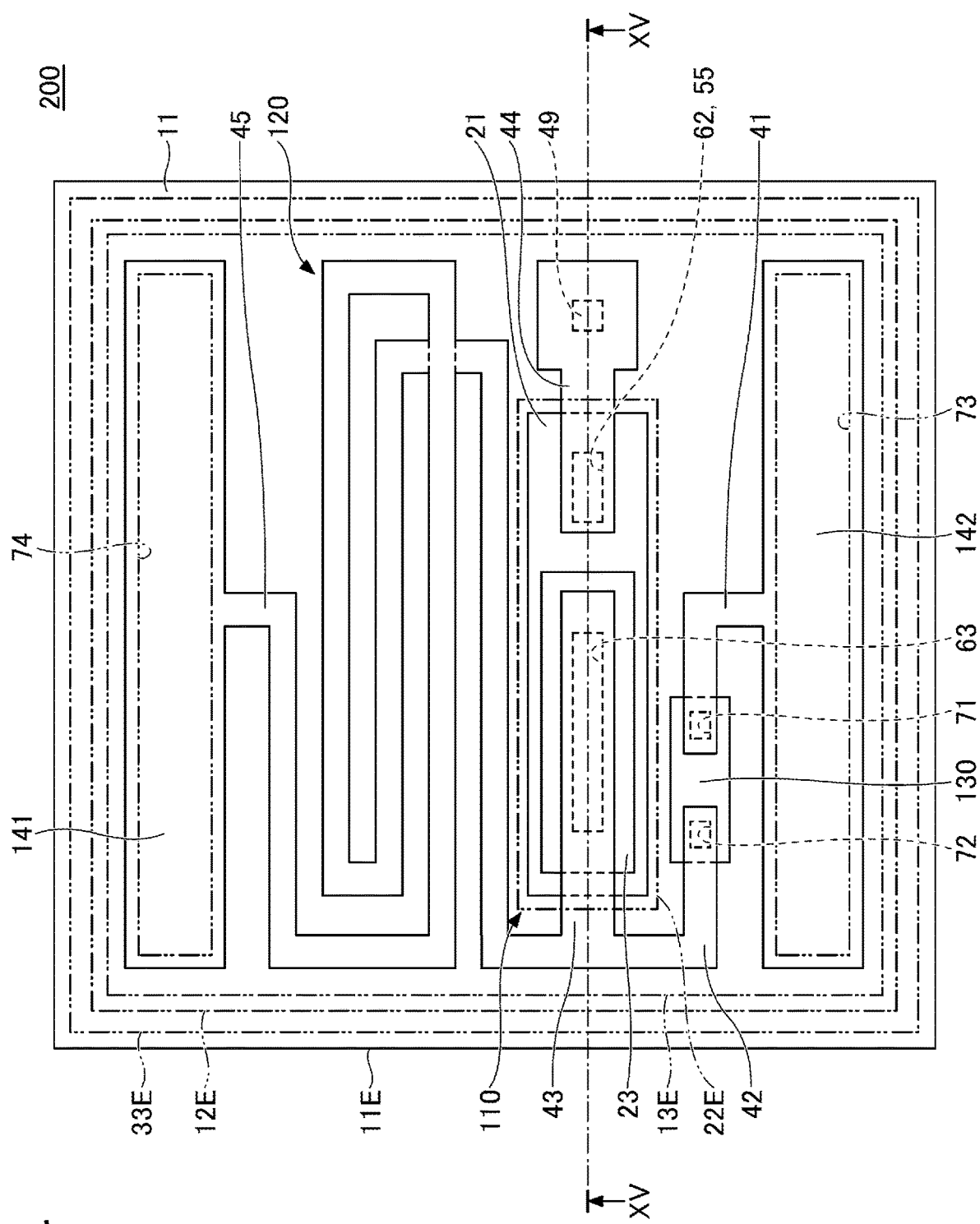
FIG. 14 is a top view illustrating an electronic device according to a second embodiment.
Figure 15:
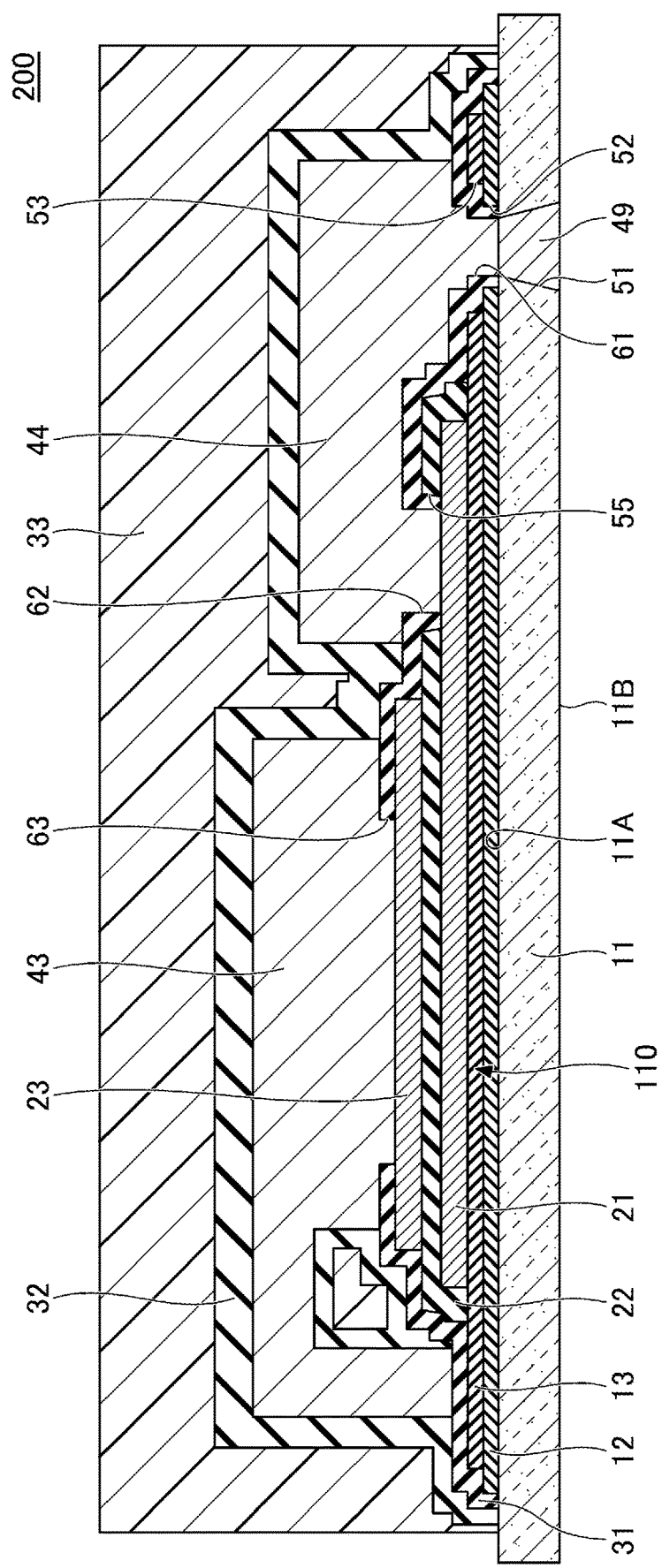
FIG. 15 is a cross-sectional view illustrating the electronic device according to the second embodiment.

In the following, a second embodiment will be described. The second embodiment relates to an electronic device including a capacitor. FIG. 14 is a top view illustrating an electronic device according to the second embodiment. FIG. 15 is a cross-sectional view illustrating an electronic device according to the second embodiment. FIG. 15 corresponds to a cross-sectional view taken along line XV-XV in FIG. 14. In FIG. 14, a part of the configuration is omitted as in FIG. 2.

As shown in FIGS. 14 and 15, electronic device 200 according to the second embodiment is different from the first embodiment mainly in the shape of dielectric film 22. That is, while dielectric film 22 is widely provided in the first embodiment, dielectric film 22 is provided only around capacitor 110 in the second embodiment. Due to the difference in the shape of dielectric film 22, the shapes of interconnect 43, interconnect 44, silicon nitride film 31, silicon nitride film 32, and passivation film 33 are slightly different from those of the first embodiment.

The other configurations of the second embodiment are the same as those of the first embodiment.

The electronic device according to the second embodiment also has at least the effects of suppressing the leak current and suppressing the separation as the first embodiment.

The electronic device to which the present disclosure is applied is not limited to the IPD. For example, the present disclosure may be applied to a monolithic microwave integrated circuit (MMIC).

The first silicon nitride film may have a multilayer structure. That is, the first silicon nitride film may include a plurality of silicon nitride films. In this case, resistive element 130 may be disposed between the plurality of silicon nitride films.

Although the embodiments and the like of the present disclosure have been described in detail above, the present disclosure is not limited to the above-described embodiments and the like. Various changes, modifications, substitutions, additions, deletions, and combinations are possible within the scope of the claims. These also naturally fall within the technical scope of the present disclosure.

What is claimed is:

1. An electronic device comprising:
a substrate;
a first silicon nitride film provided on the substrate;
a silicon oxide film provided on the first silicon nitride film;
a capacitor provided on the silicon oxide film; and
an interconnect electrically connected to the capacitor,
wherein the interconnect is disposed apart from the first silicon nitride film, and
wherein, in a plan view, an outer perimeter of the silicon oxide film is inside an outer perimeter of the first silicon nitride film.

2. The electronic device according to claim 1,
wherein the capacitor includes
a first electrode provided on the silicon oxide film,
a dielectric film provided on the first electrode, and
a second electrode provided on the dielectric film, and
wherein the dielectric film is further provided between the silicon oxide film and the interconnect.

3. The electronic device according to claim 2, further comprising:
a second silicon nitride film covering the capacitor,
wherein the second silicon nitride film is in direct contact with the first silicon nitride film outside the outer perimeter of the silicon oxide film.

4. The electronic device according to claim 2, wherein, in the plan view, a distance between an outer perimeter of the dielectric film and the outer perimeter of the first silicon nitride film is 0.5 μm to 5 μm.

5. The electronic device according to claim 3, wherein, in the plan view, a distance between an outer perimeter of the dielectric film and the outer perimeter of the first silicon nitride film is 0.5 μm to 5 μm.

6. The electronic device according to claim 1, wherein, in the plan view, a distance between the outer perimeter of the silicon oxide film and the outer perimeter of the first silicon nitride film is 0.5 μm to 10 μm.

7. The electronic device according to claim 2, wherein, in the plan view, a distance between the outer perimeter of the silicon oxide film and the outer perimeter of the first silicon nitride film is 0.5 μm to 10 μm.

8. The electronic device according to claim 1, further comprising a passivation film covering the first silicon nitride film, the silicon oxide film, the capacitor, and the interconnect.

9. The electronic device according to claim 2, further comprising a passivation film covering the first silicon nitride film, the silicon oxide film, the capacitor, and the interconnect.

10. The electronic device according to claim 8, wherein the passivation film is a polyimide film.

11. The electronic device according to claim 9, wherein the passivation film is a polyimide film.

12. The electronic device according to claim 1, further comprising an inductor and a resistive element that are connected to the capacitor.

13. The electronic device according to claim 2, further comprising an inductor and a resistive element that are connected to the capacitor.

14. An electronic device comprising:
a substrate;
a first silicon nitride film provided on the substrate;
a silicon oxide film provided on the first silicon nitride film;
a capacitor provided on the silicon oxide film;
a second silicon nitride film covering the capacitor; and an interconnect electrically connected to the capacitor,
wherein the capacitor includes
- a first electrode provided on the silicon oxide film,
- a dielectric film provided on the first electrode, and
- a second electrode provided on the dielectric film, wherein the interconnect is disposed apart from the first silicon nitride film, wherein the dielectric film is further provided between the silicon oxide film and the interconnect, wherein, in a plan view, an outer perimeter of the silicon oxide film is inside an outer perimeter of the first silicon nitride film, wherein, in the plan view, a distance between the outer perimeter of the silicon oxide film and the outer perimeter of the first silicon nitride film is 0.5 µm to 10 µm, and wherein the second silicon nitride film is in direct contact with the first silicon nitride film outside the outer perimeter of the silicon oxide film.

* * * * *